(12) United States Patent
Kim et al.

(10) Patent No.: US 9,431,279 B2
(45) Date of Patent: Aug. 30, 2016

(54) HEATER BLOCK AND A SUBSTRATE TREATMENT APPARATUS

(71) Applicant: AP SYSTEMS INC., Hwaseong-Si, Gyeonggi-Do (KR)

(72) Inventors: Chang-Kyo Kim, Hwaseong-Si (KR); Sung-Chul Kim, Hwaseong-Si (KR); Chang-Min Kwon, Osan-Si (KR); Ki-Nam Kim, Osan-Si (KR)

(73) Assignee: AP SYSTEMS INC. (KR)

( * ) Notice: Subject to any disclaimer, the term of this patent is extended or adjusted under 35 U.S.C. 154(b) by 444 days.

(21) Appl. No.: 13/895,331

(22) Filed: May 15, 2013

(65) Prior Publication Data

US 2013/0308928 A1 Nov. 21, 2013

(30) Foreign Application Priority Data

May 18, 2012 (KR) .......................... 10-2012-0052971

(51) Int. Cl.
*F27B 5/14* (2006.01)
*H01L 21/67* (2006.01)

(52) U.S. Cl.
CPC ................................ *H01L 21/67115* (2013.01)

(58) Field of Classification Search
CPC .................................................. H01L 21/67115

USPC .................. 219/390, 405; 392/411, 416, 417
See application file for complete search history.

(56) References Cited

U.S. PATENT DOCUMENTS

| | | | | |
|---|---|---|---|---|
| 4,975,561 A | * | 12/1990 | Robinson | C23C 16/481 219/390 |
| 2001/0027969 A1 | * | 10/2001 | Takahashi et al. | 219/390 |
| 2006/0291823 A1 | * | 12/2006 | Su et al. | 392/318 |
| 2008/0102207 A1 | | 5/2008 | Tsai et al. | |
| 2009/0101633 A1 | | 4/2009 | Aggarwal et al. | |

FOREIGN PATENT DOCUMENTS

| | | |
|---|---|---|
| CN | 102414800 A | 4/2012 |
| JP | 2001291677 A | 10/2001 |
| JP | 3504436 B2 | 3/2004 |
| JP | 2009212185 A | 9/2009 |
| KR | 20020056194 A | 7/2002 |
| KR | 20090026899 A | 3/2009 |
| KR | 101031226 | 4/2011 |

\* cited by examiner

*Primary Examiner* — Thien S Tran

(57) ABSTRACT

The present invention relates to a heater block and a substrate treatment apparatus, and more particularly to a heater block to perform heat treatment on a substrate and a substrate treatment apparatus having the same. According to embodiments of the present invention, it is provided a heater block for a substrate treatment apparatus having heating lamps on its one side to transfer heat to a target subjected to heat treatment, the heating lamps having different arrangement patterns in a plurality of regions on said one side.

14 Claims, 4 Drawing Sheets

HEATER BLOCK AND A SUBSTRATE TREATMENT APPARATUS

TECHNICAL FIELD

The present invention relates to a heater block and a substrate treatment apparatus, and more particularly to a heater block to perform heat treatment on a substrate and a substrate treatment apparatus having the same.

BACKGROUND

Heat treatment is a requisite procedure for a semiconductor process, and is required in ohmic contact alloying, ion-implantation damage annealing, dopant activation, thin film formation such as TiN, $TiSi_2$, $CoSi_2$, and the like.

Such heat treatment may be performed using apparatuses such as a furnace and a rapid thermal process (RTP) apparatus. To date, an apparatus for a rapid thermal process is not attractive since it has difficulties in maintaining a uniform temperature across a substrate, in maintaining the same temperature-time property between substrates when a substrate (wafer) is changed, or in measuring and controlling temperature of a substrate. However, a recent advance in temperature measurement and control techniques promotes the replacement of a furnace by a rapid thermal apparatus.

A rapid thermal apparatus transfers heat to a substrate using radiant light from a tungsten halogen lamp. Therefore, such a rapid thermal apparatus has a heater block, and a plurality of tungsten halogen lamps are provided on one side faced with a substrate among sides of the heater block. A uniform temperature should be maintained throughout a substrate even when a rapid thermal apparatus is used, because a ununifom temperature of substrate causes severe problems such as substrate warpage, dislocation, thin film slip, and the like.

To solve such a temperature uniformity problem, a technique for measuring and controlling accurately a substrate temperature, a technique for transferring uniform heat across a substrate and the like are required. A technique for transferring uniform heat across a substrate is associated with an arrangement of tungsten halogen lamps. Numerous techniques associated with an arrangement of tungsten halogen lamps have been known. For example, KR Patent No. 1031226 discloses a concentric arrangement and a tessellated arrangement of lamps irradiating radiant light on a substrate.

SUMMARY

Problems to be Solved

It is an object of the present invention to provide a heater block for a substrate treatment apparatus having heating lamps arranged to transfer uniform heat across a surface of a target subjected to heat treatment.

It is another object of the present invention to provide uniform heat treatment in an instant thermal process known as a spike process.

Means to Solve the Problems

According to an embodiment of the present invention, it is provided a heater block for a substrate treatment apparatus having heating lamps on its one side to transfer heat to a target subjected to heat treatment, wherein the heating lamps have different arrangement patterns in a plurality of regions on said one side.

Further, a plurality of regions is divided along a distance from a central point of said one side, and the heating lamps have a honeycomb arrangement in a central region at an innermost portion among the plurality of regions.

Further, a boundary of the central region is placed at a point within one half of an outermost boundary of said one side, and the number of heating lamps 120 placed in the central region is less than or equal to the number of heating lamps placed in a peripheral region, resulting in a dense arrangement in the central region.

Further, the heating lamps have a concentric, tessellated or linear arrangement in a peripheral region external to the central region, or any combination thereof.

According to another embodiment of the present invention, it is provided a substrate treatment apparatus comprising a processing chamber having a space for heat treatment on a substrate; a heater block having heating lamps generating heat energy, where the heating lamps have different arrangement patterns in a plurality of regions on its one side; and a quartz window to maintain a sealing between the processing chamber and a heating housing and to pass through heat energy reflected by the heating housing to transfer it to the substrate.

Effects of the Invention

According to embodiments of the present invention, heat can be uniformly delivered across a surface of a target subjected to heat treatment. Heating lamps are controlled by monitoring a temperature of a target subjected to heat treatment in real time, and by switching on/off power supply by heating lamps according to monitoring results. However, according to embodiments of the present invention, since circular lamps are densely mounted in a central region of a mounting surface in a honeycomb arrangement, a temperature of a central region in target subjected to heat treatment can be accurately and easily controlled. Furthermore, according to embodiments of the present invention, since T-shaped lamps are disposed in arrangements other than honeycomb arrangement in regions (peripheral regions) other than the central region, high economic feasibility can be obtained. Moreover, since a maximum dense arrangement of lamps is achieved, an instant thermal process (spike process) is possible.

DETAILED DESCRIPTION OF THE INVENTION

Hereinafter, preferable embodiments of a heater block for a rapid thermal apparatus according to the present invention will be described in detail with reference to the accompanying drawings. Terminology used herein should not be limitingly construed as common meanings or dictionary definitions. Such terminology should be construed as meanings and concepts conforming to the technical spirit of the present invention under the rule that the inventor can properly define concepts of terms to describe the inventor's invention in the best manner.

In the following description, as a substrate treatment apparatus for performing heat treatment on a substrate as a target subjected to heat treatment, a rapid thermal apparatus will be exemplified. However, it will be apparent that the present invention is applicable to various substrate treatment apparatuses capable of performing heat treatment other than the rapid thermal apparatus.

Figure 1:
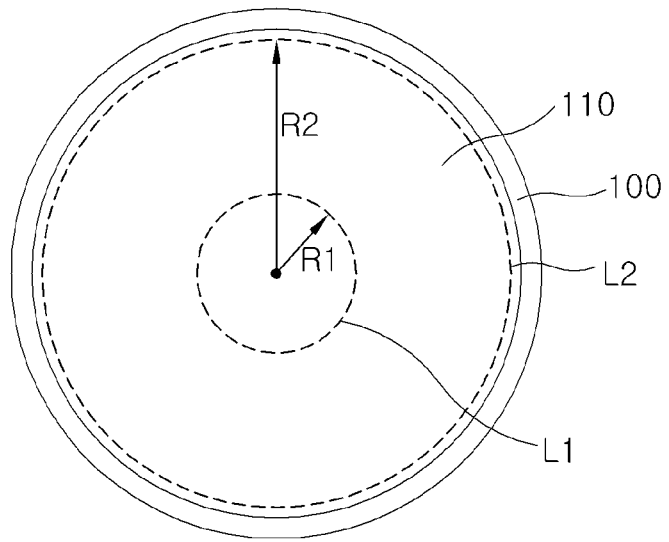
FIG. 1 is a bottom view showing a mounting surface of a heater block according to the present invention.
Figure 2:
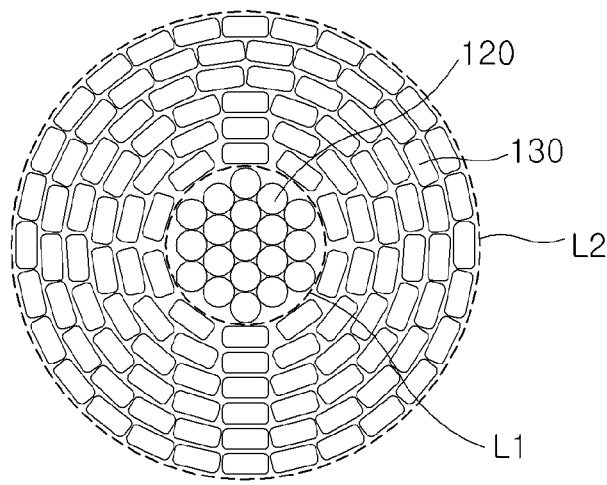
FIG. 2 is a bottom view showing the mounting surface of FIG. 1 with heating lamps being mounted.

FIG. 1 is a bottom view showing a mounting surface of a heater block according to the present invention, and FIG. 2 is a bottom view showing the mounting surface of FIG. 1 with heating lamps being mounted.

According to the present invention, a heater block 100 is provided in an apparatus for a rapid thermal process (RTP) (not shown) to heat a target (not shown) subjected to heat treatment such as a substrate, which has a mounting surface 110 on which heating lamps are placed. The mounting surface 110 is faced with a target subjected to heat treatment and has a plurality of heating lamps 120, 130 disposed thereon. These heating lamps 120, 130 irradiate light on a rotating target subjected to heat treatment.

In a conventional manner, T-shaped lamps 130 were installed throughout the mounting surface 110. These T-shaped heating lamps 130 exhibit a rectangular form having 22 mm length and 12 mm width as viewed from a target subjected to heat treatment. T-shaped lamps could be also installed as having various lengths and widths which may be larger or smaller than the rectangular form of 22 mm length and 12 mm width.

Further, in a conventional manner, T-shaped lamps 130 were disposed as a single arrangement pattern across the mounting surface 110, such as a concentric or tessellated arrangement. However, when a heat treatment target is heated using such a conventional heater block, there is a problem that a central region of the target is not uniformly heated.

To solve this problem, according to the present invention, the heating lamps 120, 130 have different arrangement patterns in a plurality of regions on the mounting surface 110. A plurality of regions is divided along a distance from a central point of the mounting surface 110. For example, as shown in FIG. 1, if an outermost boundary L2 of the mounting surface 110 is placed at a distance of R2 from a central point of the mount surface 110, a central region is within a boundary L1 placed at a distance of R1 from the central point of the mount surface 110, and a peripheral region is between L1 and L2.

Figure 3:
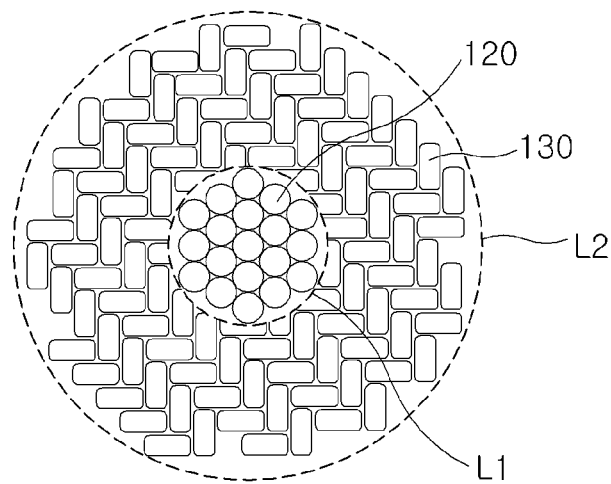
FIGS. 3 and 4 are bottom views showing examples modified form FIG. 2.
Figure 4:
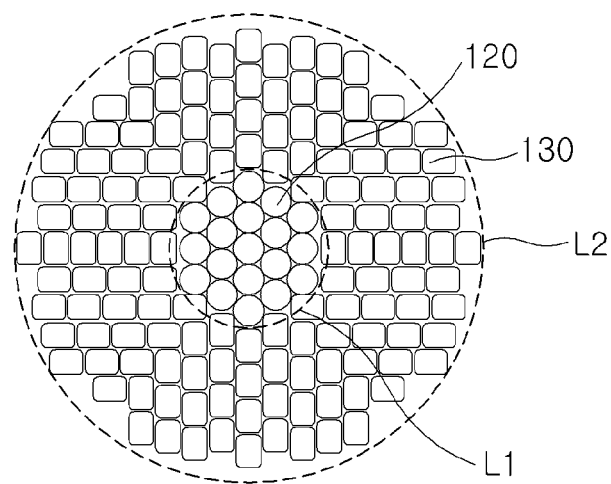

The present invention is characterized in that the heating lamps 120 installed in the central region have an arrangement pattern other than arrangement patterns of the heating lamps 130 installed in the peripheral region. That is, the heating lamps 130 in the peripheral region are installed as a concentric or tessellated arrangement, while the heating lamps 120 in the central region are installed as a honeycomb arrangement, not such a concentric or tessellated arrangement. The honeycomb arrangement is an arrangement pattern of regular hexagon structure, in which one heating lamp is disposed at a central portion and six heating lamps are disposed around the central portion, as shown in FIG. 2 to FIG. 4. By installing the heating lamps 120 in the central region as described above, a density of lamps, i.e. the number of heating lamps installed in the central region may be increased. As such, the number of the heating lamps 120 disposed in the central region is less than or equal to the number of the heating lamps 130 disposed in the peripheral region, resulting in a dense arrangement in the central region.

The heating lamps 120 installed in the central region as a honeycomb arrangement may have various shapes known in the art, such as a circular lamp, a T-shaped lamp and the like. For example, when the heating lamps 120 installed in the central region as a honeycomb arrangement are circular lamps, such circular lamps have a diameter smaller than a length of T-shaped lamps which are the heating lamps 130 disposed in the peripheral region. Alternatively, when the heating lamps 120 installed in the central region as a honeycomb arrangement are T-shaped lamps, they may have the same shape as T-shaped lamps which are the heating lamps 130 disposed in the peripheral region as an arrangement other than the honeycomb arrangement (for example, a concentric or tessellated arrangement, etc.).

The heating lamps 130 installed in the peripheral region may have various shapes such as a circular lamp, a T-shaped lamp and the like. Also, the heating lamps 130 installed in the peripheral region may have any arrangement known in the art as long as it is not a honeycomb arrangement as in the central region. For example, the heating lamps 130 installed in the peripheral region have a concentric arrangement as shown in FIG. 2, or a tessellated arrangement as shown in FIG. 3. Since such a concentric or tessellated arrangement has been fully described in KR Patent No. 1031226, a detailed description on these arrangements will be omitted herein. Alternatively, the heating lamps 130 installed in the peripheral region may have a linear arrangement as shown in FIG. 4 and other arrangements not shown herein.

Additionally, the heating lamps 130 installed in the peripheral region may have any combination of concentric, tessellated and linear arrangements. In this case, the peripheral region may be divided into multiple regions along a distance from a center of the mounting surface 110, and said arrangements may be provided for each of such divided regions.

An effect of the present invention was confirmed by an experiment. In this experiment, a thin film is formed on a substrate having 150 mm radius using a rapid thermal oxidation (RTO) process. To this end, circular lamps having 15 mm diameter are installed as the heating lamps 120 of central region, and rectangular T-shaped lamps 130 having 22 mm length and 12 mm width are installed as the heating lamps 130 of peripheral region.

The heating lamps 120 of central region were disposed as a honeycomb arrangement in the central region, and the heating lamps 130 of peripheral region were disposed as a tessellated arrangement in the peripheral region. A radius R1 of central region boundary L1 was set as ⅙ of a radius R2 of outermost boundary L2.

Figure 5:
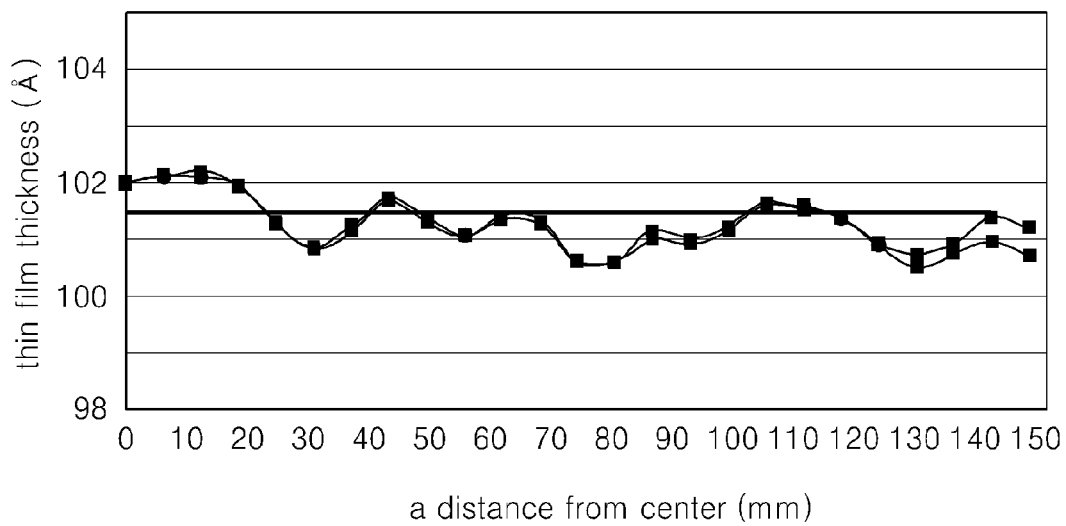
FIG. 5 is a graph showing experiment results on a heater block according to the present invention.

Under this condition, a thickness of a thin film formed on the substrate was measured along a distance from a center of the substrate. The results are shown in FIG. 5. As can be seen from FIG. 5, a difference in thin film thickness along a distance from a center of the substrate was only within 0.8 Angstrom [Ω].

Figure 6:
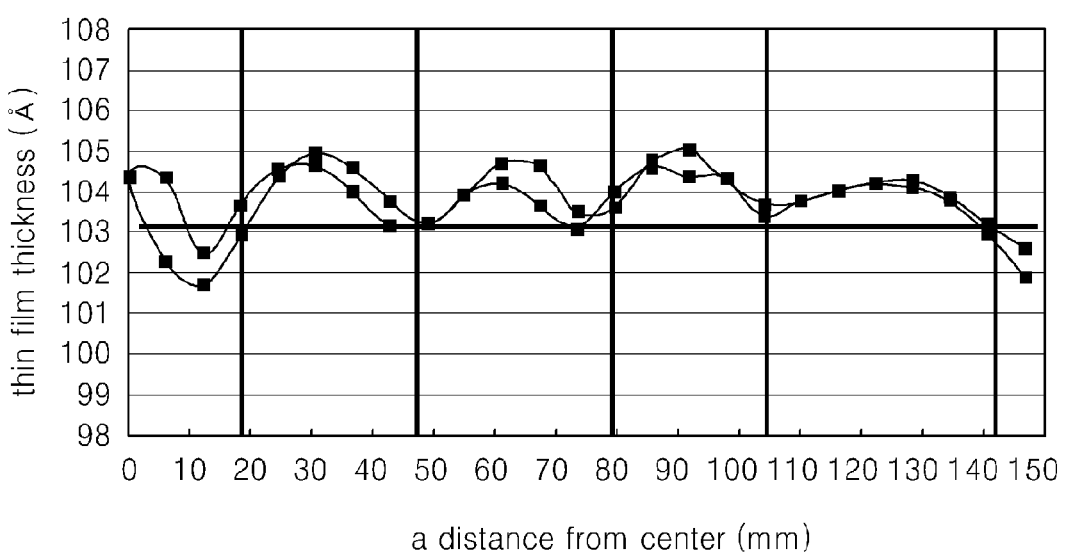
FIGS. 6 and 7 are graphs showing experiment results on a conventional heater block.
Figure 7:
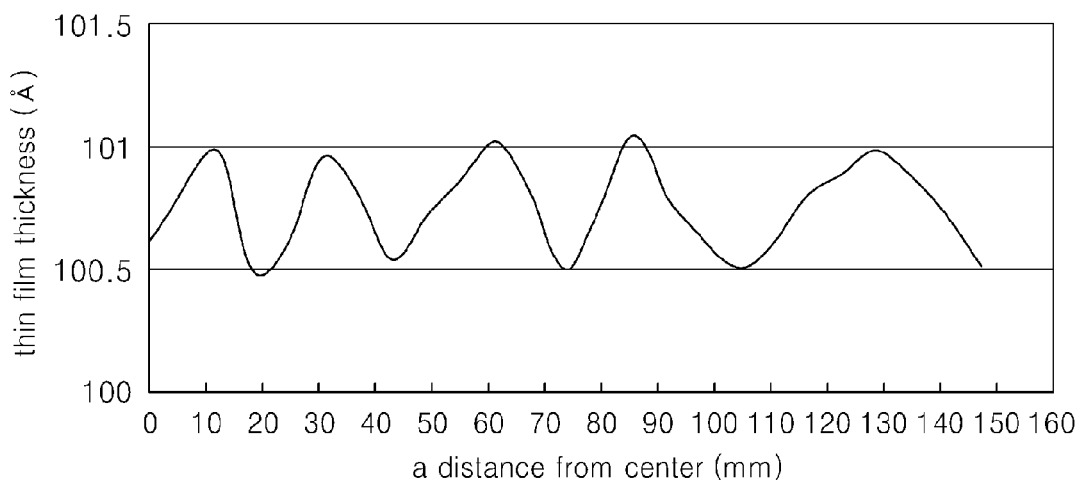

Also, an experiment was performed on a conventional heater block in which the heating lamps 130 of peripheral region were provided as concentric and tessellated arrangements across the mounting surface 110, wherein the heating lamps 130 were identical with those used in the experiment previously described. The results are shown in FIG. 6 and FIG. 7. As can be seen from FIG. 6 and FIG. 7, when the heating lamps 130 of peripheral region were disposed as concentric and tessellated arrangements across the mounting surface 110, a difference in thin film thickness along a distance from a center of the substrate was the maximum 1.7 and 3.3 Angstroms [Ω], respectively.

From said results, it can be demonstrated that the heating lamps 120 of central region having a honeycomb arrangement distribute to an improvement in uniformity of temperature transferred to a target subjected to heat treatment. However, if such a honeycomb arrangement for the heating lamps 120 of central region is provided throughout the mounting surface 110, the number of required heating lamps is uneconomically increased. Also, as shown in FIG. 6 and FIG. 7, for a region from a point which is ½ of a radius R2 of outermost boundary L2 to the outermost boundary L2, a difference in thin film thickness is not relatively large. Therefore, a radius R1 of central region boundary L1 where the heating lamps 120 of central region have a honeycomb arrangement is preferably less than ½ of a radius R2 of outermost boundary L2.

As such, a lamp structure having double arrangements according to embodiments of the present invention is applicable to a rapid thermal process (for example, spike process). For example, it is applicable to a laser spike annealing (LSA) process using high power laser for a short time at a temperature close to a dopant activation temperature for deposits on a substrate.

Figure 8:
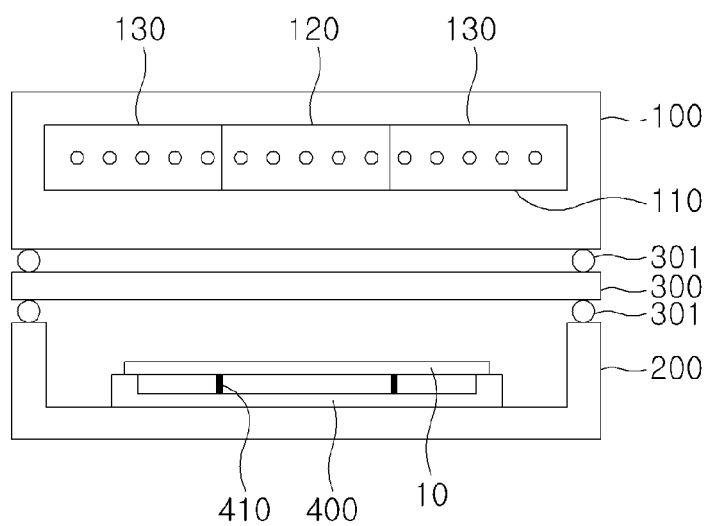
FIG. 8 shows a cross-sectional view of a rapid thermal apparatus having a heater block according to an embodiment of the present invention.

FIG. 8 shows a cross-sectional view of a rapid thermal apparatus having a heater block according to an embodiment of the present invention.

A processing chamber 200 has an inner space in which a substrate is situated and subjected to heat treatment. The processing chamber 200 is formed as a hollow quadrangled container, but not limited to and may be formed as various shapes. That is, it may be formed as cylindrical and polygonal-shaped containers. An entry port for entering and exiting a substrate 10 is each provided on one side and the other side of the processing chamber, and either entry port is connected to a transferring module (not shown).

The processing chamber 200 has a substrate support 400 therein to support a substrate. The substrate support may have a plurality of lift pins 410 therein which move vertically, and comprises an edge ring on which a substrate is situated during a process. The edge ring is a holding means to situate a substrate at a position faced with a heating housing within a heat treatment space. The substrate support may be connected to an ascending and descending means, for example a cylinder. In this embodiment, lift pins supports a substrate as previously described, but not limited to and various means to support a substrate on the substrate support, for example means using electrostatic power (electrostatic chuck) or vacuum aspiration may be used.

A heater block 100 has heating lamps that emits heat energy. A mounting surface 110 for heating lamps is faced with a target subjected to heat treatment such as a substrate, and has a plurality of heating lamps 120, 130. These heating lamps 120, 130 irradiate light on a rotating target subjected to heat treatment. A plurality of heating lamps includes heating lamps 120 in a central region and heating lamps 130 in a peripheral region.

According to the present invention, the heating lamps 120, 130 have different arrangement patterns in a plurality of regions on the mounting surface 110. A plurality of regions is divided along a distance from a central point of the mounting surface 110. For example, as shown in FIG. 1, if an outermost boundary L2 of the mounting surface 110 is placed at a distance of R2 from a central point of the mount surface 110, the central region is a region within a boundary L1 placed at a distance of R1 from the central point of the mount surface 110, and the peripheral region is a region between L1 and L2.

The heating lamps 120 installed in the central region have an arrangement pattern other than arrangement patterns of the heating lamps 130 installed in the peripheral region. That is, the heating lamps 130 installed in the peripheral region have arrangement patterns such as a concentric or tessellated arrangement, while the heating lamps 120 installed in the central region have a honeycomb arrangement pattern not a concentric or tessellated arrangement. The heating lamps 120 installed in the central region as a honeycomb arrangement may have various shapes such as a circular lamp, a T-shaped lamp and the like.

The heating lamps 130 installed in the peripheral region may have various shapes such as a circular lamp, a T-shaped lamp and the like. Also, the heating lamps 130 installed in the peripheral region may have any arrangement known in the art as long as it is not a honeycomb arrangement as in the central region. Additionally, the heating lamps 130 installed in the peripheral region may have any combination of concentric, tessellated and linear arrangements. In this case, the peripheral region may be divided into multiple regions along a distance from a center of the mounting surface 110, and said arrangements may be provided for each of such divided regions.

A quartz window is provided between the heater block 100 and the processing chamber 200, which is made from a material transmitting heat to a substrate below the window. The quartz window maintains a sealing between the heating housing and the processing chamber. It maintains the heater block 100 as a vacuum state by blocking a gap between the heating housing and the processing chamber using a sealing means 301, and protects the processing chamber from external environments (pressure, gases, contaminants). Also, the quartz window protects heating lamps and prevents impurities generated due to heat from the heating lamp from dropping on the substrate situated in a heat treatment space within the chamber.

The present invention has been described with reference to certain embodiments and the accompanying drawings. However, the present invention is not limited to these embodiments and drawings, and it is to be understood by one with ordinary skill in the art that various modifications and variations may be made to the present invention without departing from the scope of the following claims.

DESCRIPTIONS OF REFERENCE NUMBERS

100: heater block 110: mounting surface
120: circular lamp 130: T-shaped lamp
L1: central region boundary L2: outermost boundary
R1: radius of central region boundary R2: radius of outermost boundary

The invention claimed is:
1. A heater block for a substrate treatment apparatus, the heater block comprising:
heating lamps positioned to transfer heat from one side of the heater block to a target subjected to heat treatment, wherein the heating lamps have different arrangement patterns in a plurality of regions on said one side, wherein the plurality of regions are divided into a central region at an innermost portion of said one side of the heater block and a peripheral region external to the central region, wherein the heating lamps include circular shaped heating lamps and T-shaped heating lamps, wherein the circular shaped heating lamps are disposed on the central region and the T-shaped heating lamps heating lamps are disposed on the peripheral region;

wherein the peripheral region is divided into a plurality of regions along a distance from a central point; and wherein the heating lamps disposed on the peripheral region have a combined arrangement of at least two or more arrangements among a concentric arrangement, a tessellated arrangement, and a linear arrangement.

2. The heater block of claim 1 wherein the plurality of regions are divided along a distance from a central point of said one side of the heater block.

3. The heater block of claim 1 wherein the heating lamps have a honeycomb arrangement in the central region.

4. The heater block of claim 1 wherein a boundary of the central region is placed at a point within one half of an outermost boundary of said one side.

5. The heater block of claim 1 wherein the number of the heating lamps placed in the central region is less than or equal to the number of heating lamps placed in the peripheral region, resulting in a dense arrangement in the central region.

6. A substrate treatment apparatus comprising:
a processing chamber having a space for heat treatment on a substrate; and
a heater block comprising:
heating lamps generating heat energy,
wherein the heating lamps have different arrangement patterns in a plurality of regions on one side of the heater block; and
a quartz window to maintain a sealing between the processing chamber and a heating housing and to pass through heat energy reflected by the heating housing to transfer it to the substrate,
wherein the plurality of regions are divided into a central region at an innermost portion of said one side of the heater block and a peripheral region external to the central region; and
wherein the heating lamps include circular shaped heating lamps and T-shaped heating lamps, the circular shaped heating lamps are disposed on the central region and the T-shaped heating lamps heating lamps are disposed on the peripheral region;
wherein the peripheral region is divided into a plurality of regions along a distance from a central point; and
wherein the heating lamps disposed on the peripheral region have a combined arrangement of at least two or more arrangements among a concentric arrangement, a tessellated arrangement, and a linear arrangement.

7. The substrate treatment apparatus of claim 6 wherein the plurality of regions are divided along a distance from a central point of said one side of the heater block.

8. The substrate treatment apparatus of claim 6 wherein the heating lamps have a honeycomb arrangement in the central region.

9. The substrate treatment apparatus of claim 6 wherein a boundary of the central region is placed at a point within one half of an outermost boundary of said one side.

10. The heater block of claim 1, wherein a diameter of the circular shaped heating lamps is smaller than a length of the T-shaped heating lamps.

11. The substrate treatment apparatus of claim 6, wherein a diameter of the circular heating lamps is smaller than a length of the T-shaped heating lamps.

12. A heater block for a substrate treatment comprising:
a plurality of first heating lamps mounted on a central region of a surface of the heater block;
a plurality of second heating lamps mounted on a peripheral region of the surface of the heater block;
wherein the peripheral region is external to the central region;
wherein the plurality of first heating lamps have a shape different from that of the second heating lamps; and
wherein the plurality of first heating lamps are arranged in a pattern different from that of the plurality of second heating lamps;
wherein the peripheral region is divided into a plurality of regions along a distance from a central point; and
wherein the plurality of second heating lamps have a combined arrangement, in the divided regions, of at least two or more arrangements among a concentric arrangement, a tessellated arrangement, and a linear arrangement.

13. A heater block of claim 12, wherein the first heating lamps have a circular shape and the second heating lamps have a rectangular shape in a plan view.

14. A heater block of claim 12, wherein a diameter of the first heating lamps is less than a length of the second heating lamps.

* * * * *